(12) United States Patent
Hu et al.

(10) Patent No.: US 9,035,461 B2
(45) Date of Patent: May 19, 2015

(54) PACKAGED SEMICONDUCTOR DEVICES AND PACKAGING METHODS

(71) Applicant: Taiwan Semiconductor Manufacturing Company, Ltd., Hsin-Chu (TW)

(72) Inventors: Yen-Chang Hu, Tai-Chung (TW); Ching-Wen Hsiao, Hsin-Chu (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/754,518

(22) Filed: Jan. 30, 2013

(65) Prior Publication Data
US 2014/0210099 A1    Jul. 31, 2014

(51) Int. Cl.
*H01L 29/40* (2006.01)
*H01L 23/538* (2006.01)
*H01L 21/56* (2006.01)
*H01L 23/00* (2006.01)

(52) U.S. Cl.
CPC ............ *H01L 23/5384* (2013.01); *H01L 21/56* (2013.01); *H01L 24/19* (2013.01); *H01L 2224/73267* (2013.01)

(58) Field of Classification Search
USPC .................................. 257/666–796; 438/106
See application file for complete search history.

(56) References Cited

U.S. PATENT DOCUMENTS

| | | | |
|---|---|---|---|
| 8,097,490 B1 * | 1/2012 | Pagaila et al. .................. | 438/106 |
| 2003/0089969 A1 * | 5/2003 | Hashimoto .................... | 257/669 |
| 2008/0265410 A1 * | 10/2008 | Chang et al. .................. | 257/737 |
| 2011/0215449 A1 * | 9/2011 | Camacho et al. ............. | 257/659 |
| 2012/0074580 A1 * | 3/2012 | Nalla et al. .................... | 257/774 |

* cited by examiner

*Primary Examiner* — Cuong Q Nguyen
*Assistant Examiner* — Nishath Yasmeen
(74) *Attorney, Agent, or Firm* — Slater & Matsil, L.L.P.

(57) ABSTRACT

Packaged semiconductor devices and packaging methods are disclosed. In some embodiments, a packaged semiconductor device includes an integrated circuit die and through-vias disposed in a molding compound. A first redistribution layer (RDL) is disposed over a first side of the through-vias, the integrated circuit die, and the molding compound. A second RDL is disposed over a second side of the through-vias, the integrated circuit die, and the molding compound. Contact pads are disposed over the second RDL. An insulating material of the second RDL includes a recess around a perimeter of one of the contact pads.

19 Claims, 11 Drawing Sheets

PACKAGED SEMICONDUCTOR DEVICES AND PACKAGING METHODS

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One type of smaller packaging for semiconductor devices that has been developed is wafer level packaging (WLPs), in which integrated circuit die are packaged in packages that typically include a redistribution layer (RDL) that is used to fan out wiring for contact pads of the integrated circuit die so that electrical contact can be made on a larger pitch than contact pads of the die.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to packaging methods and devices for semiconductor devices. Novel packaging methods, packages, and packaged semiconductor devices will be described herein.

Figure 1:
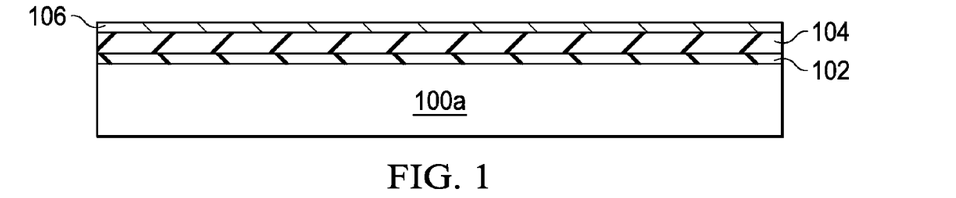
FIGS. 1 through 12 illustrate cross-sectional views of a method of packaging a semiconductor device at various stages in accordance with some embodiments of the present disclosure.

FIGS. 1 through 12 illustrate cross-sectional views of a method of packaging a semiconductor device at various stages in accordance with some embodiments of the present disclosure. Referring first to FIG. 1, a carrier 100a is provided. The carrier 100a is also referred to herein as a first carrier 100a. The carrier 100a may comprise a wafer comprising glass, silicon (e.g., a silicon wafer), silicon oxide, metal plate, a ceramic material, or other materials, as examples. An adhesive 102 is applied over the carrier wafer 100a, also shown in FIG. 1. The adhesive 102 comprises an adhesion layer that may comprise foil, epoxy, silicone rubber, a polymer, and/or a metal, as examples, although other materials may also be used. The adhesive 102 comprises a die attach film (DAF) in some embodiments, as another example. The adhesive 102 may be formed on the carrier 100a by spin-coating, printing, chemical vapor deposition (CVD), or physical vapor deposition (PVD), as examples. If the adhesive 102 comprises a foil, the foil may be laminated onto the carrier 100a, for example. The adhesive 102 is not included in some embodiments.

An insulating material 104 is formed over the adhesive 102, also shown in FIG. 1. If the adhesive 102 is not included, the insulating material 104 is formed directly over the first carrier 100a, for example. The insulating material 104 comprises about 3 to about 45 µm of a material such as polybenzoxazole (PBO), polyimide, or other insulators or passivation materials deposited by spin coating or film lamination, as examples. Alternatively, the insulating material 104 may comprise other materials and dimensions and may be formed using other methods. The insulating material 104 is not included in some embodiments. The insulating material 104 functions as a buffer dam in some embodiments to protect the adhesive 102, which may be easily damaged by various chemicals used in the packaging process in some embodiments, for example.

A seed layer 106 is formed over the insulating material 104, also shown in FIG. 1. If the insulating material 104 is not included, the seed layer 106 is formed directly on the adhesive 102, for example. If the adhesive 102 is not included, the seed layer 106 is formed directly on the first carrier 102a, as another example. The seed layer 106 comprises about 0.5K to about 5K (i.e., where 1K=0.1 µm) of a material such as Cu, TiCu, AlTiCu, Ti, or multiple layers or combinations thereof that is deposited using PVD in some embodiments. Alternatively, the seed layer 106 may comprise other materials and dimensions and may be formed using other methods.

Figure 2:
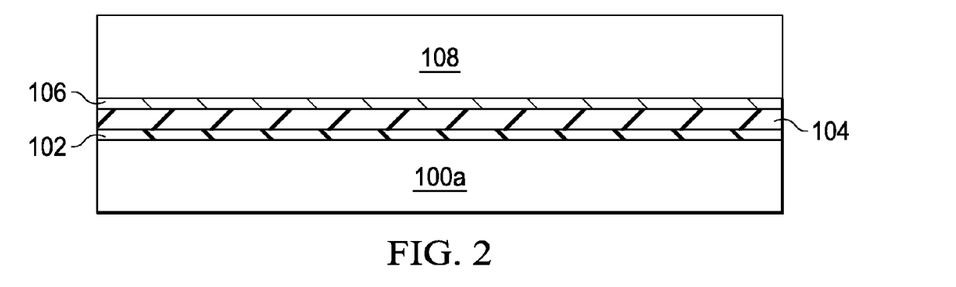

A sacrificial layer 108 is formed over the seed layer 106, as shown in FIG. 2. The sacrificial layer 108 comprises an insulating material and may comprise a dry photoresist film in some embodiments. The sacrificial layer 108 has a thickness of about 25 to about 300 μm, for example. The sacrificial layer 108 may be formed by spin coating or film lamination in some embodiments. Alternatively, the sacrificial layer 108 may comprise other materials and dimensions and may be formed using other methods.

The sacrificial layer 108 is patterned using lithography with a pattern for a plurality of through-vias 110 (see FIG. 3) that will be formed within the sacrificial layer 108. The sacrificial layer 108 may be patterned using a direct patterning method in some embodiments. Alternatively, the sacrificial layer 108 may be patterned by exposing the sacrificial layer 108 to energy or light reflect from or transmitted through a lithography mask having a desired pattern thereon. The sacrificial layer 108 is developed, and exposed (or unexposed, depending on whether the sacrificial layer 108 comprises a positive or negative photosensitive material) regions of the sacrificial layer 108 are removed using an ashing and/or etching process.

If the sacrificial layer 108 does not comprise a photosensitive material, the sacrificial layer 108 may be patterned in some embodiments by forming a photoresist (not shown) over the sacrificial layer 108, and patterning the photoresist by exposure to energy or light reflect from or transmitted through a lithography mask having a desired pattern thereon. The photoresist is developed, and exposed (or unexposed, depending on whether the photoresist is positive or negative) regions of the photoresist are removed using an ashing and/or etching process. Alternatively, the photoresist may be patterned using a direct patterning method. The photoresist is then used as an etch mask during an etching process in order to etch and form patterns in the sacrificial material 108. The photoresist is then removed.

Figure 3:
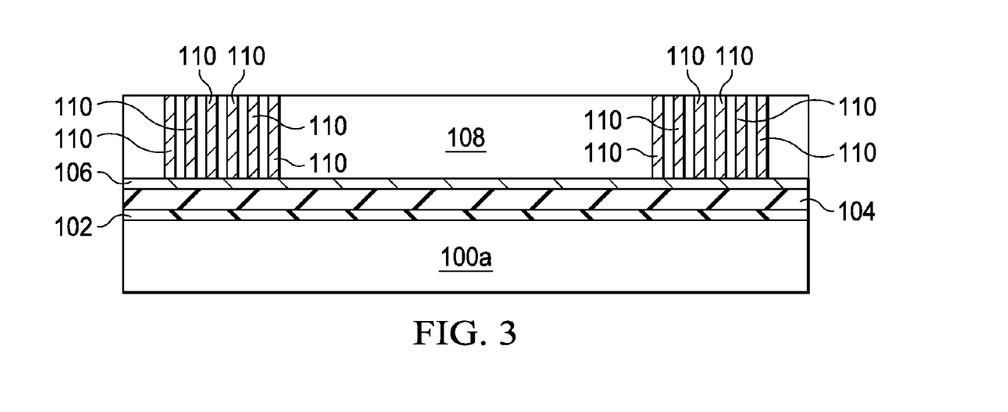
Figure 4:
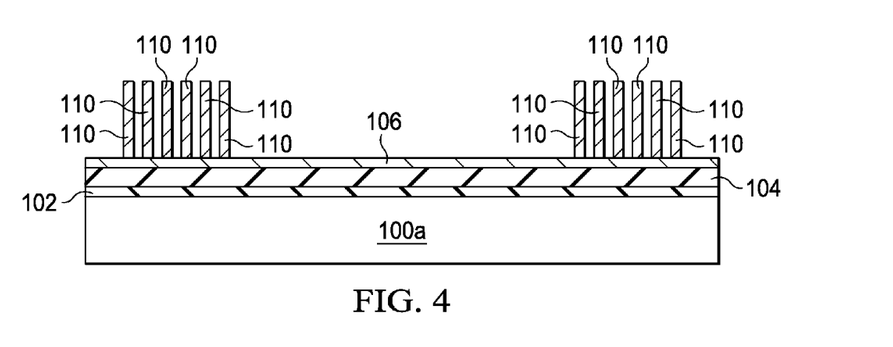

Next, a plurality of through-vias 110 is formed over the seed layer 106 within the patterned sacrificial layer 108, as shown in FIG. 3. The through-vias 110 comprise through-assembly-vias (TAV's) in some embodiments, for example. The through-vias 110 comprise a conductive material such as Cu or a Cu alloy, for example. Alternatively, the through-vias 110 may comprise other conductive materials. The through-vias 110 are formed over the seed layer 106 using a plating process in some embodiments, for example. The plating process may comprise an electro-chemical plating (ECP) process or an electro-less plating process, as examples. Alternatively, the through-vias 110 may be formed using other methods, such as deposition process. The sacrificial layer 108 is then removed or stripped, as shown in FIG. 4, leaving the plurality of through-vias 110 disposed over the seed layer 106.

Figure 5:
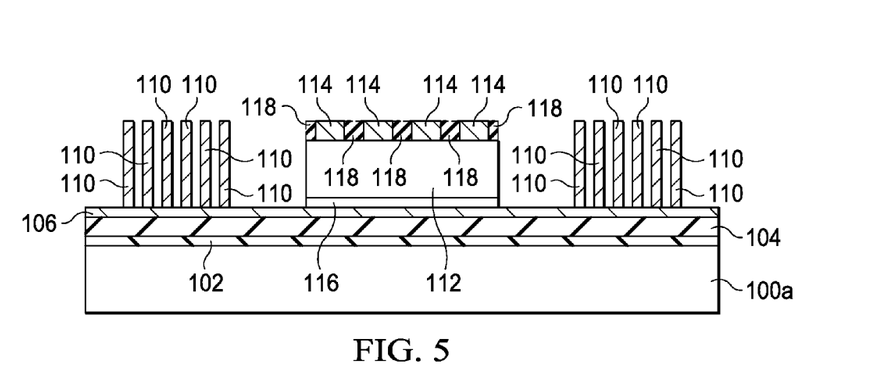

An integrated circuit die 112 is disposed over the seed layer 106, as shown in FIG. 5. The integrated circuit die 112 may be coupled to the seed layer 106 using an adhesive 116 using a die attach process, for example. The integrated circuit die 112 may include a plurality of contacts 114 disposed on a surface thereof. The plurality of contacts 114 are disposed within an insulating material 118 in some embodiments, shown in dashed lines in FIG. 5. The contacts 114 may comprise Cu, a Cu alloy, or other metals, and the insulating material 118 may comprise silicon oxide, silicon nitride, other insulators, or combinations thereof. The contacts 114 and insulating material 118 may alternatively comprise other materials. In some embodiments, the insulating material 118 is not included. The integrated circuit die 112 is attached in a flip-chip method in some embodiments, wherein a top surface of the integrated circuit die 112 is adhered to the seed layer 106 using the adhesive 116, and the bottom surface of the integrated circuit die 112 that includes the contacts 114 is placed face-up over the first carrier wafer 100a.

The integrated circuit die 112 comprises a semiconductor device that is packaged in accordance with the methods described herein, for example. The integrated circuit die 112 includes circuitry, elements, and components that are formed over a workpiece which may include a semiconductor substrate comprising silicon or other semiconductor materials and may be covered by an insulating layer, for example. The workpiece of the integrated circuit die 112 may comprise silicon oxide over single-crystal silicon, and may include conductive layers and semiconductor elements, such as transistors, diodes, capacitors, etc., not shown.

In some embodiments, the through-vias 110 are arranged in one or more rows and columns around an edge of a region of the first carrier wafer 100a, and the integrated circuit die 112 is placed in a central region of the through-vias 110, as illustrated in the cross-sectional view in FIG. 5. Alternatively, the through-vias 110 and the integrated circuit die 112 may comprise other relative positions over the first carrier wafer 100a. Note that only one integrated circuit die 112 is shown in the drawings; however, in accordance with some embodiments, a plurality of the integrated circuit dies 112 is disposed over the first carrier wafer 100a and is simultaneously packaged, with each integrated circuit die 112 having an associated set of through-vias 110 included in the package. After the packaging processes described herein, the packaged semiconductor devices are separated or singulated along scribe lines, not shown.

Figure 6:
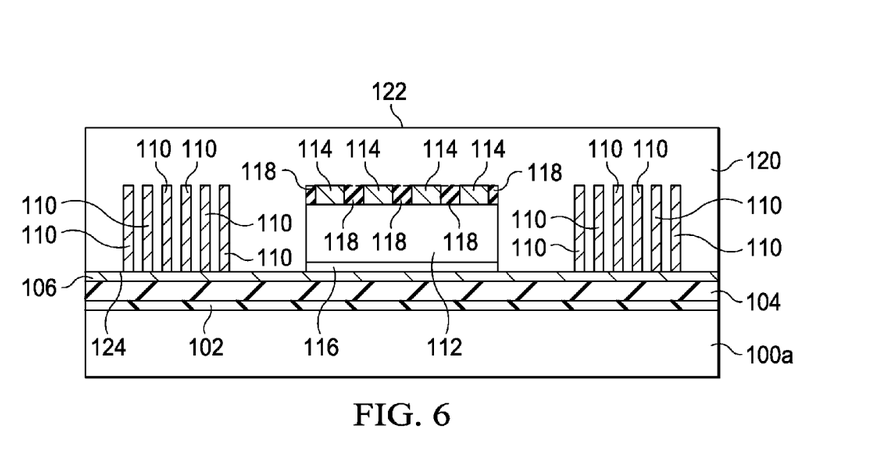

Next, a molding compound 120 is formed over the plurality of through-vias 110, the integrated circuit die 112, and exposed portions of the seed layer 106, as shown in FIG. 6. The molding compound 120 may comprise compression molding and may comprise epoxy, rubber, or polyimide (PI) in some embodiments, for example, although the molding compound 120 may alternatively comprise other materials. The molding compound 120 comprises an insulating material that fills spaces between the plurality of through-vias 110 and also fills spaces between the plurality of through-vias 110 and the integrated circuit die 112. After forming the molding compound 120, a portion of the molding compound 120 may be formed over the ends (e.g., the top surfaces) of the through-vias 110 and the contacts 114 of the integrated circuit die 112, as shown in FIG. 6. The molding compound 120, the through-vias 110, and the integrated circuit die 112 have a first side 122 and a second side 124 that is opposite the first side 122.

Figure 7:
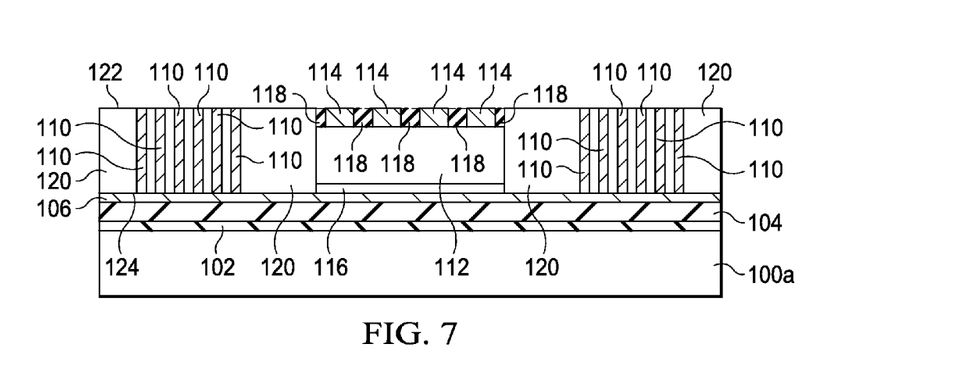

A top portion of the molding compound 120 is then removed from over a surface of the through-vias 110 or a surface of the integrated circuit die 112, as shown in FIG. 7, exposing the top surfaces of the ends of the plurality of through-vias 110 and the contacts 114 disposed on the surface of the integrated circuit die 112, as shown in FIG. 7. The top portion of the molding compound 120 is removed using a grinding process, a chemical-mechanical polishing (CMP) process, an etch process, other methods, or combinations thereof, as examples.

Figure 8:
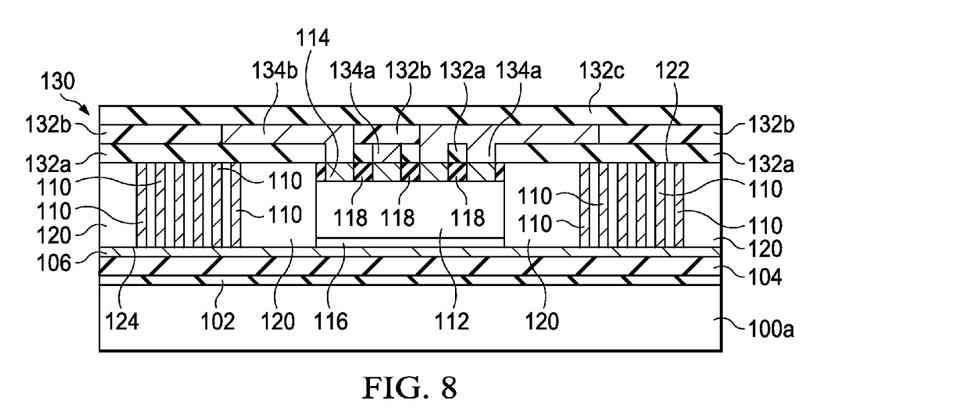

Next, a first redistribution layer (RDL) 130 is formed over the first side 122 of the plurality of through-vias 110, the integrated circuit die 112, and the molding compound 120, as shown in FIG. 8. The first RDL 130 includes a plurality of conductive features comprising conductive materials 134a and 134b that are disposed in a plurality of insulating materials 132a and 132b, respectively. An additional insulating material 132c is disposed over insulating material 132b in some embodiments. The conductive features comprising the conductive material 134a and 134b may be formed using subtractive etch techniques, damascene techniques, plating processes, and/or combinations thereof, for example.

For example, in a subtractive technique, conductive features comprising conductive material 134a may be formed by depositing the conductive material 134a, and patterning the conductive material 134a using a lithography process. The insulating material 132a is then formed between the conductive features comprising the conductive material 134a. In a damascene technique, the insulating material 132a is first deposited, and the insulating material 132a is patterned using a lithography process. The conductive material 134a is then formed over the patterned insulating material, filling the patterns. A dual damascene method can also be used to simultaneously form the conductive features comprising the conductive materials 134a and 134b within the insulating materials 132a and 132b, respectively. In some embodiments, at least portions of the conductive features 134a and 134b comprise seed layers and/or have portions that are plated on, e.g., over the seed layers.

In some embodiments, the first RDL 130 is formed by depositing the insulating material 132a, and patterning the insulating material 132a using lithography. A seed layer (not shown) is formed over the insulating material 132a, covering the patterns in the insulating material 132a and the top surface of the insulating material 132a. A conductive material is plated onto the seed layer using an ECP process or electro-less plating process, forming the conductive material 134a within the patterns in the insulating material 132a and forming a solid layer of conductive material 134b on the top surface of the insulating material 132a. The solid layer of conductive material 134b is then patterned using lithography to form conductive lines or traces of the conductive material 134b. Insulating material 132b is then formed over and between the patterned conductive material 134b. A top portion of insulating material 134b comprises insulating material 132c in some embodiments, for example.

Conductive materials 134a comprise vias, and conductive materials 134b comprises conductive lines or traces in some embodiments, as examples. Forming the first RDL 130 comprises coupling portions of the first RDL 130 to the plurality of contacts 114 disposed on the surface of the integrated circuit die 112 in some embodiments. At least some of the vias 134a are coupled to the contacts 114 on the surface of the integrated circuit die 112, for example.

Portions of the conductive material 134b may be coupled to one or more of the vias comprising conductive material 134a, for example. Portions of the conductive materials 134b may comprise fan-out wiring of the first RDL 130 that provides horizontal connections of the package in some embodiments, as another example. Insulating material 132c may later be patterned and filled with a conductive material 134c (not shown in FIG. 8; see FIG. 23) to form vias that are electrically connected to portions of conductive material 134b comprising conductive lines or traces, for example, to be described further herein. In some embodiments, insulating material 132c is not included in the first RDL 130, as another example.

Referring again to FIG. 8, insulating materials 132a, 132b, and 132c comprise a material such as PBO, polyimide, or other polymer materials or insulators deposited using spin coating, as examples. Insulating material 132a comprises a thickness of about 2 µm to about 10 µm, insulating material 132b comprises a thickness of about 1.5 µm to about 7 µm, and insulating material 132c comprises a thickness of about 3 µm to about 10 µm in some embodiments, as examples. Conductive materials 134a and 134b may comprise Cu, Cu alloys, TiCu, other conductive materials, or combinations or multiple layers thereof, as examples. Alternatively, the insulating materials 132a, 132b, 132c, and conductive materials 134a and 134b may comprise other materials and dimensions and may be formed using other methods.

Figure 9:
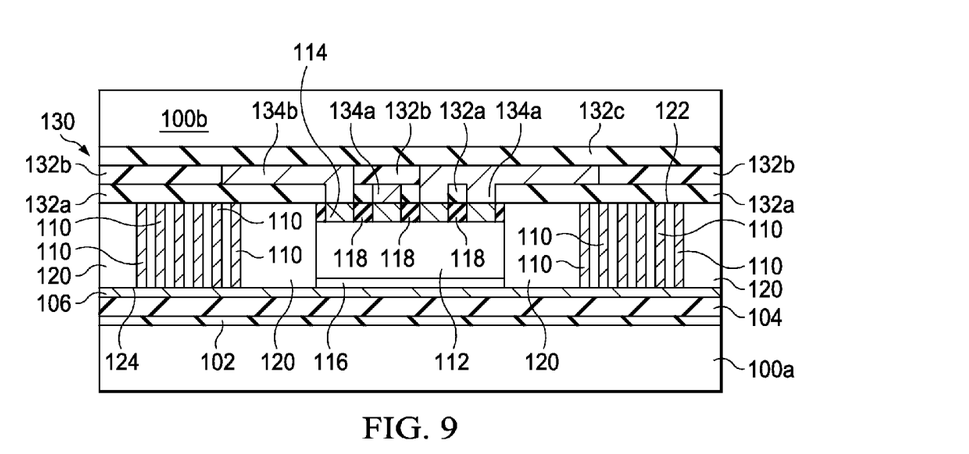
Figure 10:
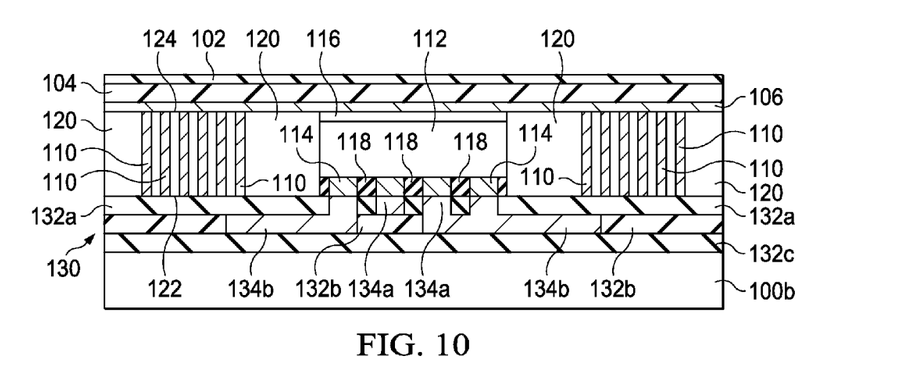
Figure 11:
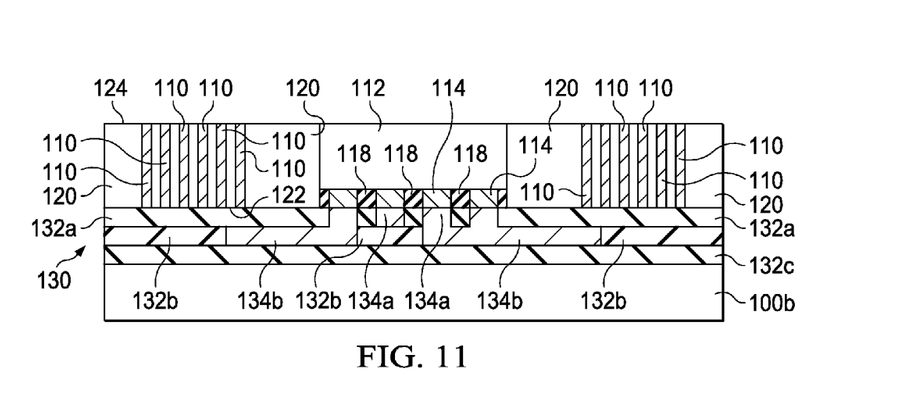

A second carrier 100b comprising a similar material described for the first carrier 100a is coupled over the first RDL 130, as shown in FIG. 9. The first carrier 100a is then removed, as shown in FIG. 10. The first carrier 100a may be de-bonded or removed by prying the first carrier 100a away from the RDL 130 with or without the use of an assist tool, for example. The adhesive 102, insulating material 104, and seed layer 106 are also removed, as shown in FIG. 11. The seed layer 106 and insulating material 104 may be removed using an etch process and/or grinding process, and the adhesive 102 may be removed using a cleaning process, as examples. The first carrier 100a, adhesive 102, insulating material 104 and seed layer 106 may alternatively be removed using other methods. The device may be inverted prior to the cleaning process, grinding process, and/or etch process used to remove the seed layer 106, the insulating material 104, and the adhesive 102, as illustrated in FIG. 10.

Figure 12:
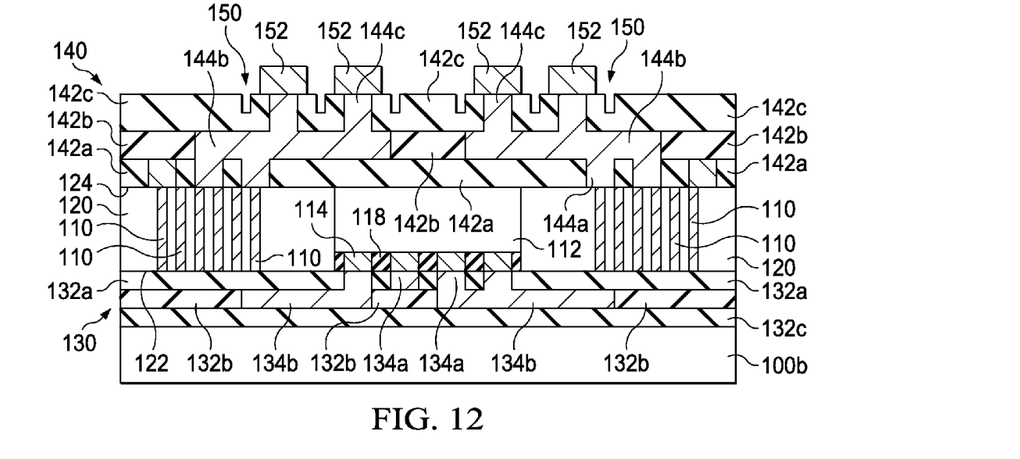

A second RDL 140 is formed over the second side 124 of the plurality of through-vias 110, the integrated circuit die 112, and the molding compound 120, as shown in FIG. 12. The second RDL 140 comprises a plurality of insulating materials 142a, 142b, and 142c and conductive materials 144a, 144b, and 144c disposed within insulating materials 142a, 142b, and 142c, respectively. Insulating materials 142a, 142b, and 142c and conductive materials 144a, 144b, and 144c may comprise similar materials, dimensions, and formation methods as were described previously herein for insulating materials 132a, 132b, and 132c and conductive materials 134a and 134b, respectively, for example.

As an example of a damascene process, in some embodiments, forming the first RDL 130 or forming the second RDL 140 may comprise forming a first insulating material 132a or 142a, patterning the first insulating material 132a or 142a, and filling the patterns in the first insulating material 132a or 142a with a first conductive material 134a or 144a. A second insulating material 132b or 142b is formed over the first insulating material 132a or 142a and the first conductive material 134a or 144a, and the second insulating material 132b or 142b is patterned. The patterns in the second insulating material 132b or 142b are filled with a second conductive material 134b or 144b. Portions of the first conductive material 134a or 144a are coupled to contacts 114 on the integrated circuit die 112 or to an end of one of the plurality of through-vias 110.

As an example of a subtractive etch process, in other embodiments, forming the first RDL 130 or forming the second RDL 140 comprises forming a first conductive material 134a or 144a, patterning the first conductive material 134a or 144a, and forming a first insulating material 132a or 142a between the patterned first conductive material 134a or 144a. A second conductive material 134b or 144b is formed over the first insulating material 132a or 142a and the first conductive material 134b or 144b, and the second conductive material 134b or 144b is patterned. A second insulating material 132b or 142b is formed between the patterned second conductive material 134b or 144b. Portions of the first conductive material 134a or 144a are coupled to contacts 114 on the integrated circuit die 112 or to an end of one of the plurality of through-vias 110.

The top insulating material 142c of the second RDL 140 includes a plurality of vias comprising a conductive material 144c formed therein. In accordance with some embodiments of the present disclosure, a recess 150 is formed in the top insulating material 142c proximate at least one region where a contact pad 152 will be formed over the insulating material 142c, also shown in FIG. 12. In some embodiments, the recess 150 is formed within the top insulating material 142c around a perimeter of at least one of a plurality of contact pads 152. In other embodiments, the recess 150 is formed within the insulating material 142c of the second RDL 140 around a perimeter of each of the plurality of contact pads 152.

Before or after the recesses 150 in the top insulating material 142c of the second RDL 140 are formed, the plurality of contact pads 152 is formed over the second RDL 140. The contact pads 152 comprise surface mount technology (SMT) pads in some embodiments. The contact pads 152 comprise part of an under-ball metallization (UBM) structure in some embodiments, for example.

In some embodiments, the recesses 150 are formed simultaneously while forming patterns for the plurality of vias 144c in the top insulating material 142c of the second RDL 104. The recesses 150 are formed during a patterning step for the vias 144c in some embodiments. For example, before the contact pads 152 are formed, the top insulating material 142c is patterned using lithography to form the recesses 150 and the patterns for the vias 144c. A conductive material is formed over the patterned insulating material 142c, and the conductive material is patterned to remove the conductive material from over the top surface of the insulating material 142c and from over the recesses 150, leaving a portion of the conductive material behind within the patterned insulating material 142c, forming the vias 144c. To form the contact pads 152, a conductive material is formed over the insulating material 142c, the recesses 150 in the insulating material 142c, and the vias 144c, and the conductive material is patterned using lithography to form the contact pads 152. In some embodiments, a contact pad 152 may be formed over one or more of each of the vias 144c.

In some embodiments, first, the recesses 150 are formed in the insulating material 142c of the second RDL 140 around a perimeter of a plurality of regions where it has been predetermined that each of the plurality of contact pads 152 will be formed. Second, each of the plurality of contact pads 152 is formed over the second RDL 140 in one of the plurality of regions where each of the plurality of contact pads was predetermined to be formed.

For example, FIGS. 13 through 21 are cross-sectional views illustrating several methods of forming recesses 150, vias 144c, and contact pads 152 in accordance with some embodiments, using lithography processes and plating processes. An upper portion of the second RDL 140 is shown in FIGS. 13 through 21.

Figure 13:
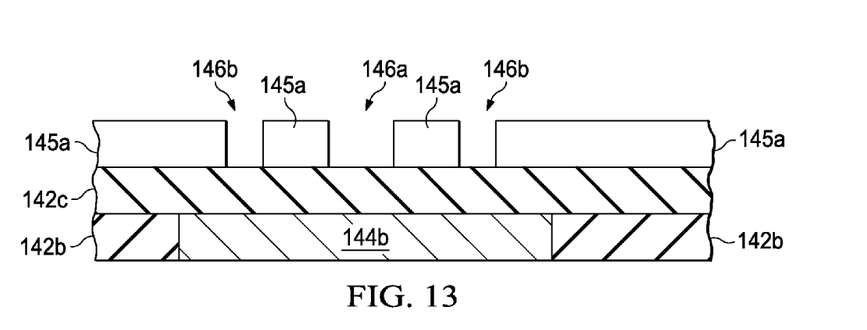
FIGS. 13 through 21 are cross-sectional views of methods of forming a portion of a package for a semiconductor device at various stages in accordance with some embodiments.
Figure 14:
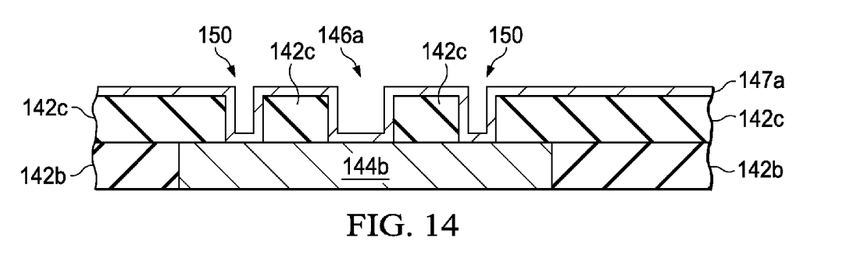
Figure 15:
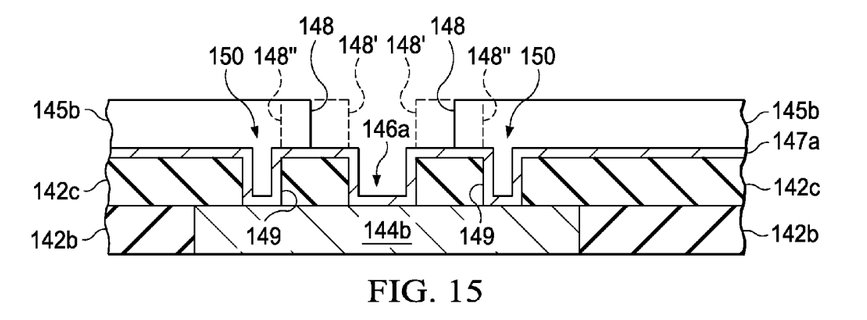

In FIGS. 13 and 14, a layer of photoresist 145a is disposed over insulating material 142c, which is disposed over insulating material 142b and conductive material 144b comprising conductive lines. The layer of photoresist 145a is patterned with patterns 146b for the recesses 150 and patterns 146a for vias 144c. The layer of photoresist 145a is then used as an etch mask during an etch process for the insulating material 142c, forming the recesses 150 and patterns 146a for the vias 144c in the insulating material 142c, as shown in FIG. 14. The layer of photoresist 145a is removed, and a seed layer 147a comprising a conductive material such as Cu, a Cu alloy, or other metals is formed over the patterned insulating material 142c. A layer of photoresist 145b is formed over the seed layer 147a as shown in FIG. 15, which fills the recesses 150 and the patterns 146a for the vias 144c with the photoresist 145b. The layer of photoresist 145b is patterned using lithography to expose at least the patterns 146a for the vias 144c in the insulating material 142c, also shown in FIG. 15.

In some embodiments, the edges 148 of the patterned layer of photoresist 145b reside over regions of the insulating material 142c that are disposed between edges 149 of the recesses 150 and edges of the patterns 146a for the vias 144c. In other embodiments, the edges 148' of the patterned layer of photoresist 145b are substantially aligned with and over the edges of the patterns 146a for the vias 144c, as shown in dashed lines at 148' in FIG. 15. In yet other embodiments, the edges 148" of the patterned layer of photoresist 145b are substantially aligned with and over the edges 149 of the recesses 150, as shown in dashed lines at 148".

Figure 16:
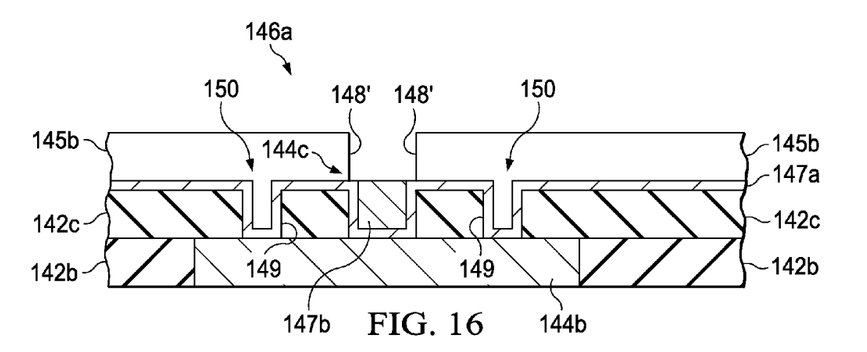
Figure 17:
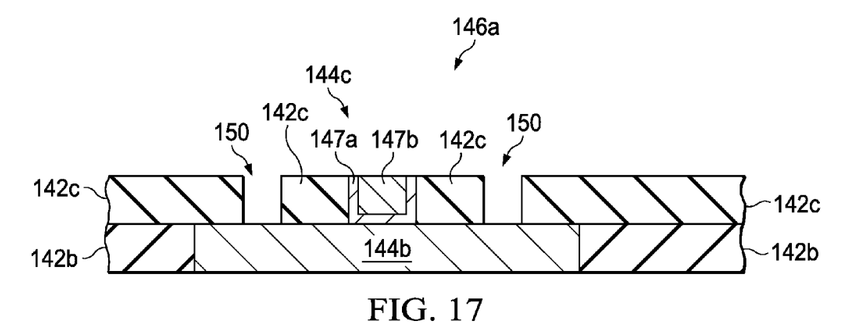

FIGS. 16 and 17 illustrate a method of filling the patterns 146a for the vias 144c with conductive material to form the vias 144c, in some embodiments wherein the edges 148' of the patterned layer of photoresist 145b are substantially aligned with and over the edges of the patterns 146a for the vias 144c. A conductive material 147b comprising Cu, a Cu alloy, or other metals is plated onto the seed layer 147a, filling the patterns 146a and forming vias 144c comprising the seed layer 147a and conductive material 147b. The layer of photoresist 145b is removed, as shown in FIG. 17, and the seed layer 147a is removed from over the top surface of insulating material 142c and the recesses 150 using an etch process and/or grinding process, leaving the via 144c disposed in the pattern 146a in the insulating material 142c. Contacts 152 (not shown in FIG. 17; see FIG. 12) may then be formed over the vias 144c using a separate deposition and lithography step.

Figure 18:
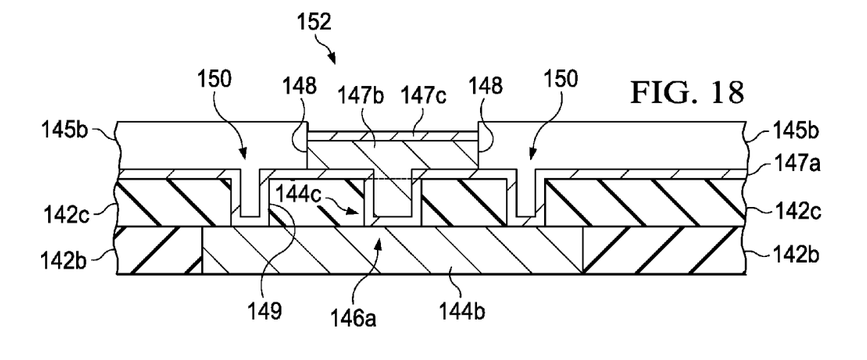
Figure 19:
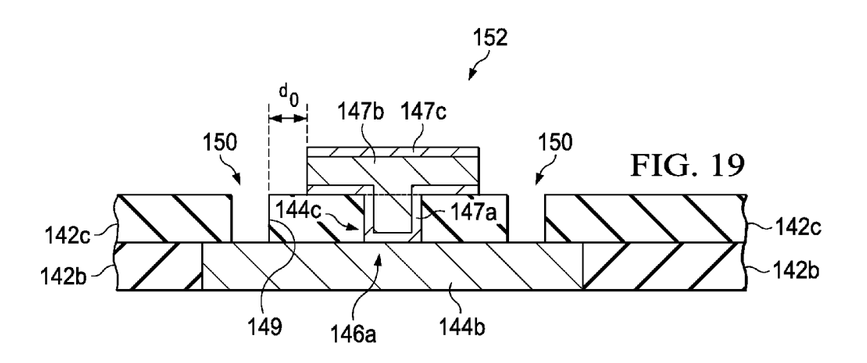

FIGS. 18 and 19 illustrate a method of filling the patterns 146a for the vias 144c with conductive material to form the vias 144c, in some embodiments wherein the edges 148 of the patterned layer of photoresist 145b reside over regions of the insulating material 142c that are disposed between edges 149 of the recesses 150 and edges of the patterns 146a for the vias 144c. Contact pads 152 are formed simultaneously during the plating process of the vias 144c. A plating process is used to form a conductive material 147b over the seed layer 147a. Contact pads 152 are also formed within the layer of photoresist 145b during the plating process. In some embodiments, a conductive material 147c which may comprise a layer of solder or other eutectic material is plated onto or deposited onto the conductive material 147b, as illustrated in FIG. 18. The layer of photoresist 145b is removed, and exposed portions of the seed layer 147a residing over the top surface and over recesses 150 in the insulating material 142c are etched away using an etch process, leaving the contact pad 152 and via 144c formed over and within insulating material 142c, as shown in FIG. 19. The contact pad 152 is disposed a predetermined distance away from the recesses 150. In some embodiments, a distance between an edge of the contact pad 152 and the edge 149 of the recess 150 comprises dimension $d_0$, wherein dimension $d_0$ comprises about 5 to about 10 μm, in order to provide a wide process margin, for example. Alternatively, dimension $d_0$ may comprise other values.

Figure 20:
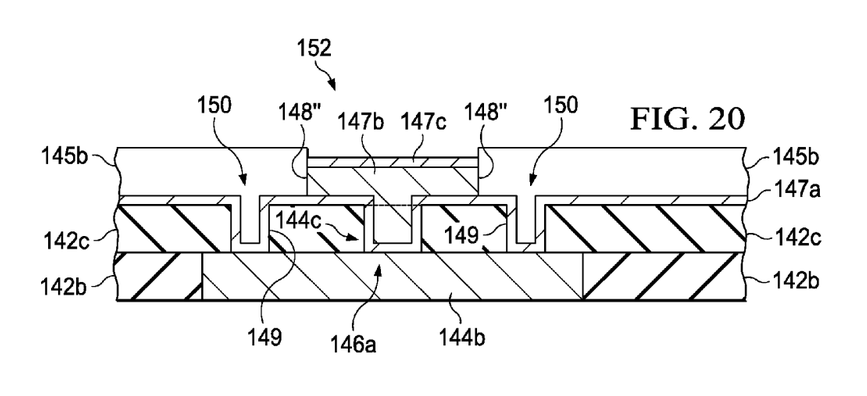
Figure 21:
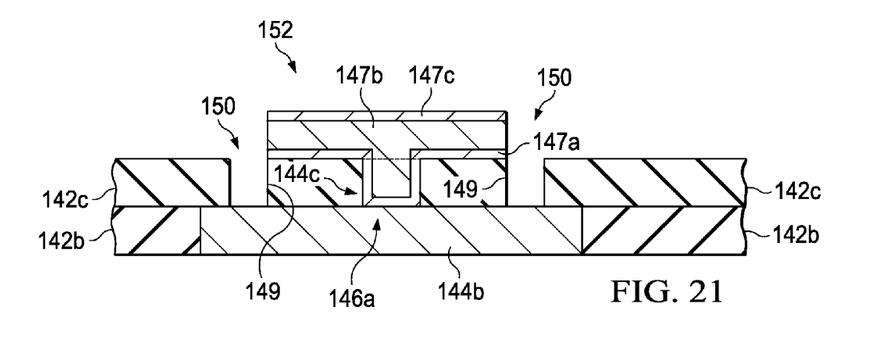

FIGS. 20 and 21 illustrate a method of filling the patterns 146a for the vias 144c with conductive material to form the vias 144c, in some embodiments wherein the edges 148" of the patterned layer of photoresist 145b are substantially aligned with and over the edges 149 of the recesses 150. Contact pads 152 are formed simultaneously during the plating process of the vias 144c, as described for the embodiment shown in FIGS. 18 and 19 and as shown in FIG. 21. The layer of photoresist 145b and excess portions of the seed layer 147a are removed, as shown in FIG. 21. Edges of the contact pads 152 are substantially aligned with edges 149 of the recesses 150 in insulating material 142c.

In other embodiments, the recesses 150 are formed after the contact pads 152 are formed (not shown in the drawings). An additional lithography process is used to form the recesses 150 in some embodiments, for example. After the contact pads 152 are formed over the second RDL 140, the top insulating material 142c is patterned to form the recesses 150 around the perimeter of each of the plurality of contact pads 152.

The insulating material 142c of the second RDL 140 is disposed adjacent the plurality of contact pads 152. Forming the recesses 150 comprises forming a trench in the insulating material 142c around a perimeter of at least one of the plurality of contact pads 152 in some embodiments, for example.

Figure 22:
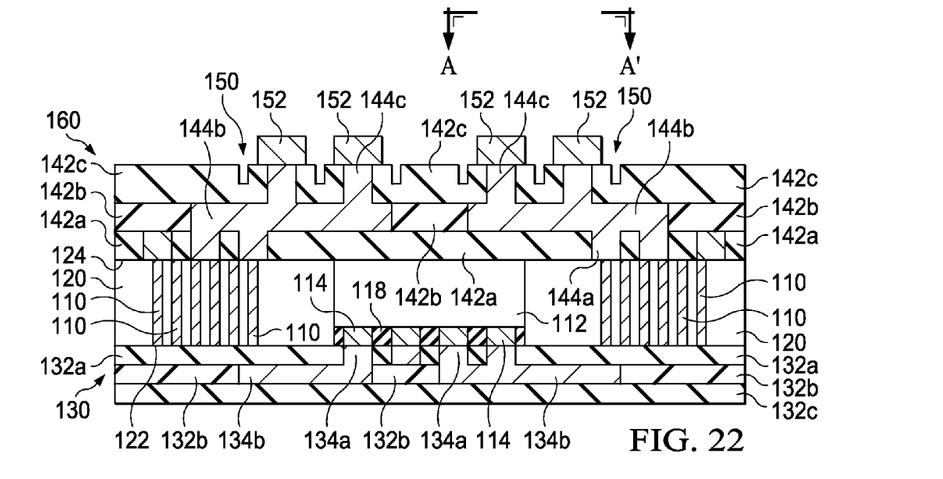
FIG. 22 is a cross-sectional view of the packaged semiconductor device shown in FIG. 12 after removal of a carrier wafer.

After the formation of the contact pads 152 and/or recesses 150, the second carrier 100b is removed, as shown in FIG. 22. The packaged semiconductor device 160 includes the integrated circuit die 112, the through-vias 110, the first RDL 130, the second RDL 140, the contact pads 152, and the molding compound 120. A package for a semiconductor device comprising the integrated circuit die 112 comprises the through-vias 110, the first RDL 130, the second RDL 140, the contact pads 152, and the molding compound 120.

Figure 23:
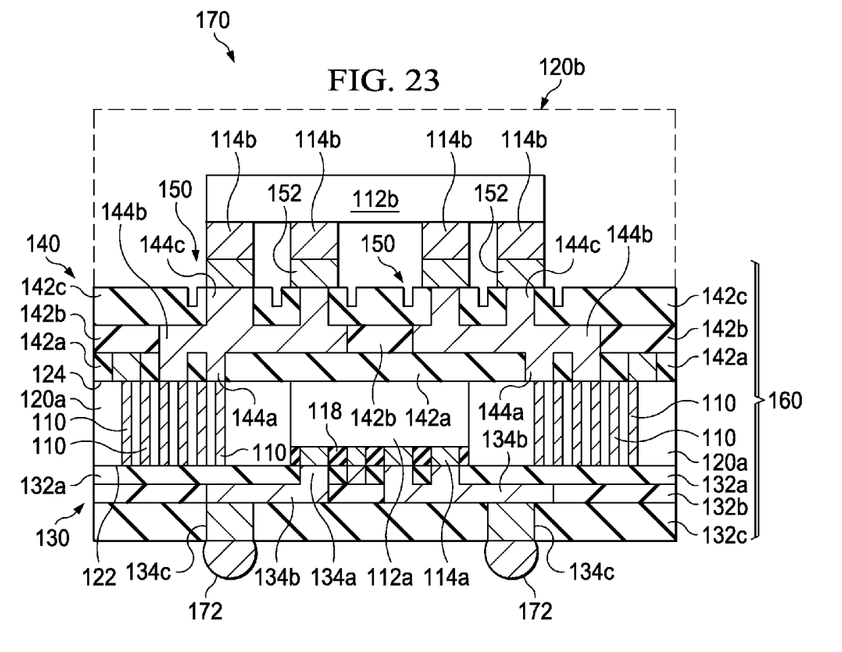
FIG. 23 is a cross-sectional view of the packaged semiconductor device shown in FIG. 22 packaged with another semiconductor device in a package-on-package (PoP) or system-in-a-package (SiP) configuration in accordance with some embodiments.

FIG. 23 is a cross-sectional view of the packaged semiconductor device 160 comprising a first integrated circuit die 112a shown in FIG. 22 packaged with another semiconductor device comprising a second integrated circuit die 112b to form a package-on-package (PoP) device or system-in-a-package (SiP) device 170 in accordance with some embodiments. Contacts 114b of the second integrated circuit die 112b are coupled to the plurality of contact pads 152 of the packaged semiconductor device 160. The contact pads 152 may comprise a layer of solder (see conductive material 147c in FIGS. 19 and 21) in some embodiments, and the solder is reflowed to electrically and mechanically couple the contacts 114b of the second integrated circuit die 112b to the contact pads 152, for example. Alternatively, the contacts 114b on the second integrated circuit die 112b may include a layer of solder, or both the contact pads 152 and the contacts 114b on the second integrated circuit die 112b may include solder, in other embodiments, for example. The novel recesses 150 around the perimeter of the contact pads 152 advantageously avoid bridging of the solder between at least two adjacent contact pads 152 during the reflowing of the solder of the contact pads 152 and/or the contacts 114b of the second integrated circuit die 112b, in some embodiments.

A molding compound 120b is formed over the integrated circuit die 112b and insulating material 142c in some embodiments. In other embodiments, the molding compound 120b is not included. A plurality of vias 134c is formed within insulating material 132c of the first RDL 130 using a lithography process, a deposition process, and/or a plating process, and a plurality of conductive balls 172 is coupled to the vias 134c. The conductive balls 172 may comprise solder balls, controlled collapse chip connection (C4) balls, or other types of electrical connections. The conductive balls 172 provide electrical connections for the PoP device or SiP device 170 and may be coupled to a printed circuit board (PCB), another packaged semiconductor device or unpackaged semiconductor device, or a mounting device or structure in an end application, for example. The first RDL 130 and the second RDL 140 comprise horizontal fan-out electrical connections of the PoP device or SiP device 170, and the through-vias 110 comprise vertical electrical connections of the PoP device or SiP device 170 in some embodiments, as examples.

Figure 24:
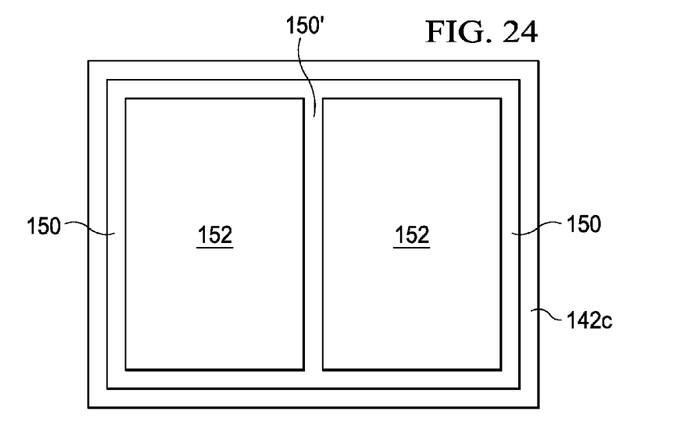
FIG. 24 is a top view of a portion of the packaged semiconductor device shown in FIG. 22 in accordance with some embodiments.

FIG. 24 is a top view of a portion of the packaged semiconductor device 160 shown in FIG. 22 at A-A' in accordance with some embodiments. The insulating material 142c of the second RDL 140 includes two recesses 150, each of the two recesses 150 being disposed around a perimeter of one of the plurality of contact pads 152. A portion of the two recesses 150 comprises a single recess 150' disposed between two adjacent contact pads 152 of the plurality of contact pads 152. The single recess 150' comprises a portion of the recesses 150 that is shared between the two adjacent contact pads 152, for example, due to the close proximity of the two contact pads 152.

Figure 25:
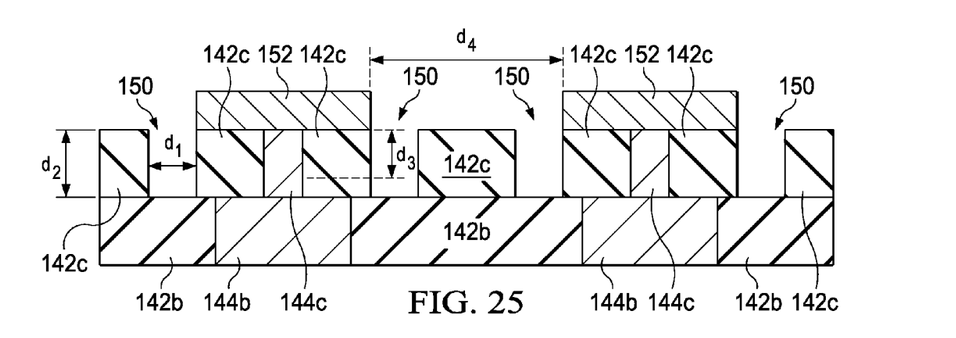
FIG. 25 is a cross-sectional view of a portion of a packaged semiconductor device in accordance with other embodiments.
Figure 26:
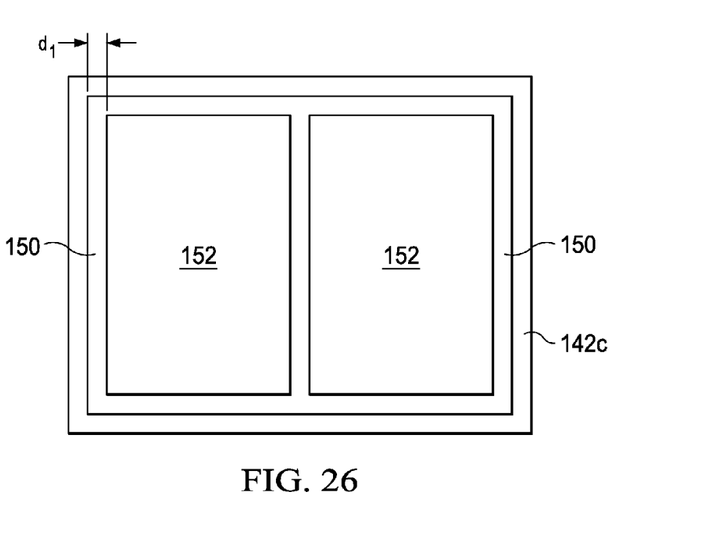
FIG. 26 is a top view of the portion of the packaged semiconductor device shown in FIG. 25.

FIG. 25 is a cross-sectional view of a portion of a packaged semiconductor device in accordance with other embodiments. FIG. 26 is a top view of the portion of the packaged semiconductor device shown in FIG. 25. Each contact pad 152 includes a recess 150 disposed around a perimeter thereof. A portion of the recesses 150 is not shared by two adjacent contact pads 152 in these embodiments. The recesses 150 comprise a width in the cross-sectional view and the top view comprising dimension $d_1$, wherein dimension $d_1$ comprises about 50 µm or less, as an example. The recesses 150 comprise a depth of dimension $d_2$ in some embodiments, wherein dimension $d_2$ comprises a thickness of insulating material 142c, for example. The recesses 150 comprise a depth of dimension $d_3$ in other embodiments, wherein dimension $d_3$ is less than a thickness of insulating material 142c, as another example. The distance comprising dimension $d_4$ between edges of adjacent contact pads 152 comprises about 250 µm or less in some embodiments. Alternatively, dimensions $d_1$, $d_2$, $d_3$, and $d_4$ may comprise other values.

Figure 27:
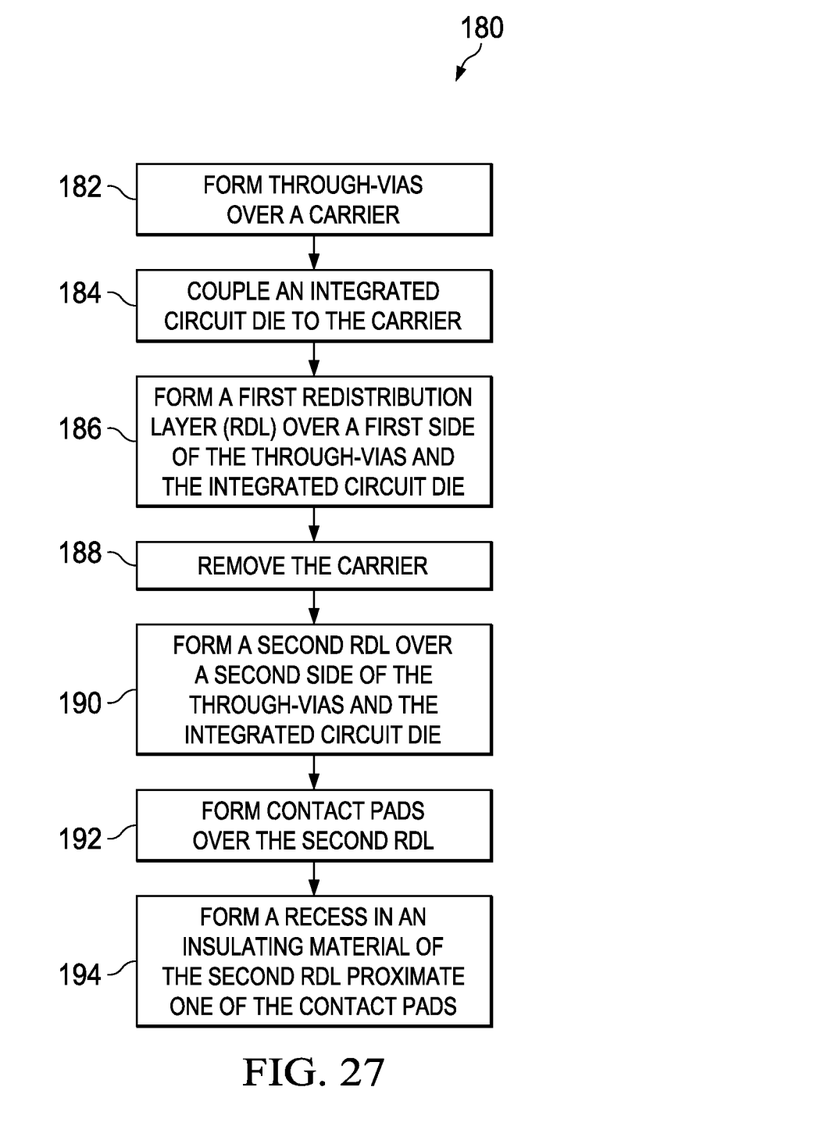
FIG. 27 is a flow chart of a method of packaging a semiconductor device in accordance with some embodiments.

FIG. 27 is a flow chart 180 of a method of packaging a semiconductor device in accordance with some embodiments. In step 182, a plurality of through-vias 110 is formed over a carrier 100a (see FIG. 4), and in step 184, an integrated circuit die 112a is coupled to the carrier 100a (see FIG. 5). In step 186, a first RDL 130 is formed over a first side of the plurality of through-vias 110 and the integrated circuit die 112a (see FIG. 8). In step 188, the carrier 100a is removed (see FIG. 10). A second RDL 140 is formed over a second side of the plurality of through-vias 110 and the integrated circuit die 112a in step 190 (see FIG. 12). A plurality of contact pads 152 is formed over the second RDL 140 in step 192. In step 194, a recess 150 is formed in an insulating material 142c of the second RDL 140 proximate one of the plurality of contact pads 152.

Some embodiments of the present disclosure include methods of packaging semiconductor devices, and also include packaged semiconductor devices that have been packaged using the novel methods described herein. Some embodiments of the present disclosure also include packages for semiconductor devices.

Advantages of some embodiments of the disclosure include providing novel packaging methods wherein wafer level packaging techniques are used to package two or more semiconductor devices together in a single packaging device. Contact pads 152 comprising surface mount technology (SMT) are included in under-metallization layers for SMT devices such as PoP devices and SiP devices 170 using a wafer level process. The novel recesses 150 described herein that are disposed around the perimeter of the contact pads 152 advantageously prevent and avoid bridging of solder between adjacent contact pads 152 during the reflowing of the solder of the contact pads 152 and/or the contacts 114b of a second integrated circuit die 112b (see FIG. 23), in some embodiments. The recesses 150 comprise trenches formed around the contact pads 152 in insulating material 142c of the second RDL 140 beneath the contact pads 152, and the recesses 150 reduce solder bridging issues after a surface mount reflow process, for example.

In some embodiments, no additional lithography masks or processes are required to form the recesses 150. The recesses 150 are formed using the same lithography mask used to pattern and form vias 144c within insulating material 142c in some embodiments, for example. The novel recesses 150 provide a cost-savings by increasing yields. The novel packaging methods, structures, and designs are easily implementable in manufacturing and packaging process flows.

In accordance with some embodiments of the present disclosure, a packaged semiconductor device includes an integrated circuit die disposed in a molding compound, and a plurality of through-vias disposed in the molding compound. A first RDL is disposed over a first side of the plurality of through-vias, the integrated circuit die, and the molding compound. A second RDL is disposed over a second side of the plurality of through-vias, the integrated circuit die, and the molding compound. A plurality of contact pads is disposed over the second RDL. An insulating material of the second RDL includes a recess around a perimeter of one of the plurality of contact pads.

In accordance with other embodiments, a method of packaging a semiconductor device includes forming a plurality of through-vias over a carrier, coupling an integrated circuit die to the carrier, and forming a first RDL over a first side of the plurality of through-vias and the integrated circuit die. The carrier is removed, and a second RDL is formed over a second side of the plurality of through-vias and the integrated circuit die. A plurality of contact pads is formed over the second RDL. A recess is formed in an insulating material of the second RDL proximate one of the plurality of contact pads.

In accordance with other embodiments, a method of packaging a semiconductor device includes forming an adhesive over a first carrier, forming a seed layer over the adhesive, and forming a sacrificial layer over the seed layer. The sacrificial layer is patterned, and a plurality of through-vias is formed over the seed layer within the patterned sacrificial layer. The sacrificial layer is removed, and an integrated circuit die is coupled over the seed layer. A molding compound is formed over the plurality of through-vias and the integrated circuit die, and a first redistribution layer (RDL) is formed over a first side of the plurality of through-vias, the integrated circuit die, and the molding compound. A second carrier is coupled over the first RDL, and the first carrier is removed. The method includes forming a second RDL over a second side of the plurality of through-vias, the integrated circuit die, and the molding compound, the second side being opposite the first side. A plurality of contact pads is formed over the second RDL, and a recess is formed in an insulating material of the second RDL around a perimeter of each of the plurality of contact pads.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of packaging a semiconductor device, the method comprising:
   forming a plurality of through-vias over a carrier;
   coupling an integrated circuit die to the carrier;
   forming a first redistribution layer (RDL) over a first side of the plurality of through-vias and the integrated circuit die;
   removing the carrier;
   forming a second RDL over a second side of the plurality of through-vias and the integrated circuit die, the second RDL being formed in an insulating material and having a topmost surface that is substantially co-planar with a topmost surface of the insulating material;
   forming a plurality of contact pads over the second RDL; and
   forming a recess in the insulating material of the second RDL proximate one of the plurality of contact pads, the recess being laterally displaced from the contact pad in the plane of the topmost surface of the insulating material;
   wherein the insulating material of the second RDL is disposed adjacent the plurality of contact pads, and wherein forming the recess comprises forming a trench in the insulating material around a perimeter of the one of the plurality of contact pads.

2. The method according to claim 1, further comprising forming a recess in the insulating material of the second RDL proximate each of the plurality of contact pads.

3. The method according to claim 1, wherein the carrier comprises a first carrier, and wherein the method further comprises coupling a second carrier over the first RDL, before removing the first carrier.

4. The method according to claim 1, further comprising forming a molding compound over the plurality of through-vias and the integrated circuit die, before forming the first RDL.

5. The method according to claim 1, wherein forming a portion of the first RDL or forming a portion of the second RDL comprises a process selected from the group consisting essentially of a damascene process, a subtractive etch process, a plating process, and combinations thereof.

6. A method of packaging a semiconductor device, the method comprising:
   forming an adhesive over a first carrier;
   forming a seed layer over the adhesive;
   forming a sacrificial layer over the seed layer;
   patterning the sacrificial layer;
   forming a plurality of through-vias over the seed layer within the patterned sacrificial layer;
   removing the sacrificial layer;
   coupling an integrated circuit die over the seed layer;
   forming a molding compound over the plurality of through-vias and the integrated circuit die;
   forming a first redistribution layer (RDL) over a first side of the plurality of through-vias, the integrated circuit die, and the molding compound;
   coupling a second carrier over the first RDL;
   removing the first carrier;
   forming a second RDL over a second side of the plurality of through-vias, the integrated circuit die, and the molding compound, the second side being opposite the first side, the second RDL being conductive and formed in an insulating material and having a top most surface substantially co-planar with a topmost surface of the insulating material;

forming a plurality of contact pads over the second RDL; and forming a recess in an insulating material of the second RDL around a perimeter of each of the plurality of contact pads.

7. The method according to claim 6, wherein forming the plurality of through-vias comprises a plating process.

8. The method according to claim 6, wherein forming the molding compound comprises forming a portion of the molding compound over a surface of the plurality of through-vias or a surface of the integrated circuit die, and wherein the method further comprises removing the portion of the molding compound from over the surface of the plurality of through-vias or the surface of the integrated circuit die using a process selected from the group consisting essentially of a grinding process, a chemical-mechanical polishing (CMP) process, an etch process, and combinations thereof.

9. The method according to claim 8, wherein removing the portion of the molding compound exposes a plurality of contacts disposed on the surface of the integrated circuit die, and wherein forming the first RDL comprises coupling portions of the first RDL to the plurality of contacts disposed on the surface of the integrated circuit die.

10. The method according to claim 6, wherein the method comprises: first, forming the plurality of contact pads over the second RDL; and second, forming the recess in the insulating material of the second RDL around the perimeter of each of the plurality of contact pads.

11. The method according to claim 6, wherein the method comprises: first, forming the recess in the insulating material of the second RDL around a perimeter of a plurality of regions where it has been predetermined that each of the plurality of contact pads will be formed; and second, forming each of the plurality of contact pads over the second RDL in one of the plurality of regions where each of the plurality of contact pads was predetermined to be formed.

12. The method according to claim 6, wherein forming the second RDL comprises forming patterns for a plurality of vias in a top insulating material layer of the second RDL, and wherein forming the recesses in the insulating material of the second RDL comprises simultaneously forming the recesses while forming the patterns for the plurality of vias in the top insulating material layer of the second RDL.

13. The method according to claim 6, wherein the integrated circuit die comprises a first integrated circuit die; wherein forming the molding compound comprises forming a first molding compound; wherein the method further comprises coupling a second integrated circuit die to the plurality of contact pads and forming a second molding compound over the second integrated circuit die and the second RDL; wherein the plurality of contact pads or contacts on the second integrated circuit die include solder; wherein coupling the second integrated circuit die to the plurality of contact pads comprises reflowing the solder of the plurality of contact pads or the contacts on the second integrated circuit die; and wherein the recess in the insulating material of the second RDL around the perimeter of each of the plurality of contact pads avoids bridging of the solder between two adjacent contact pads of the plurality of contact pads during the reflowing of the solder of the plurality of contact pads or the contacts on the second integrated circuit die.

14. A method of packaging a semiconductor device, the method comprising:

forming an intermediate structure including a die and a plurality of through-vias encased within a mold compound;

forming a first redistribution layer (RDL) over a first side of the intermediate structure;

forming a second RDL over a second side of the intermediate structure, the second RDL including a topmost insulating layer;

forming a plurality of contact pads over and electrically connected to the second RDL; and forming a plurality of recesses in the topmost insulating layer of the second RDL proximate one of the plurality of contact pads, the plurality of recesses extending only partially into the topmost insulating layer and being laterally displaced from the one of the plurality of contact pads on a plane of a major surface of the topmost insulating layer.

15. The method according to claim 14, further comprising forming a recess in the topmost insulating layer of the second RDL proximate each of the plurality of contact pads.

16. The method according to claim 14, wherein a portion of at least one recess of the plurality of recesses is shared between two contact pads.

17. The method according to claim 14, further comprising mounting the die to a carrier prior to encasing the die and plurality of through-vias in the mold compound.

18. The method according to claim 17, wherein the plurality of through-vias are formed on the molding compound prior to encasing the die and plurality of through-vias in the mold compound.

19. The method according to claim 17, wherein the carrier comprises a first carrier, and wherein the method further comprises coupling a second carrier over the first RDL, before removing the first carrier.

* * * * *